(12) United States Patent
Pagette (10) Patent No.: US 7,566,921 B2
(45) Date of Patent: Jul. 28, 2009

(54) SILICON GERMANIUM EMITTER

(75) Inventor: Francois Pagette, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/838,941

(22) Filed: Aug. 15, 2007

(65) Prior Publication Data

US 2007/0272946 A1 Nov. 29, 2007

Related U.S. Application Data

(63) Continuation of application No. 11/308,541, filed on Apr. 4, 2006, now Pat. No. 7,294,869.

(51) Int. Cl.
*H01L 29/40* (2006.01)
(52) U.S. Cl. .................. 257/197; 257/198; 257/565
(58) Field of Classification Search .......... 257/197, 257/198
See application file for complete search history.

(56) References Cited

U.S. PATENT DOCUMENTS

| | | | |
|---|---|---|---|
| 5,331,186 A | 7/1994 | Morizuka | |
| 5,352,912 A | 10/1994 | Crabbe et al. | |
| 5,440,152 A | 8/1995 | Yamazaki | |
| 6,462,397 B2 | 10/2002 | Ryum et al. | |
| 6,667,489 B2 | 12/2003 | Suzumura et al. | |
| 6,870,204 B2 | 3/2005 | Torvik et al. | |
| 7,294,869 B2 * | 11/2007 | Pagette | 257/198 |
| 2003/0054599 A1 | 3/2003 | Huizing et al. | |
| 2004/0046187 A1 | 3/2004 | Huizing et al. | |

OTHER PUBLICATIONS

Cressler, "SiGe HBT Technology: A New Contender for Si-Based RF and Microwave Circuit Applications," IEEE Transactions on Microwave Theory and Techniques, vol. 46, No. 5, May 1998, 572-589.
Cressler et al., "Silicon Germanium Heterojunction Bipolar Transistors," Artech House, Boston, MA, Dec. 2003, p. 170.

* cited by examiner

*Primary Examiner*—Jerome Jackson, Jr.
*Assistant Examiner*—Anthony Ho
(74) *Attorney, Agent, or Firm*—Gibb I.P. Law Firm, LLC; Daniel Schnurmann, Esq.

(57) ABSTRACT

Disclosed are an improved hetero-junction bipolar transistor (HBT) structure and a method of forming the structure that incorporates a silicon-germanium emitter layer with a graded germanium profile. The graded germanium concentration creates a quasi-drift field in the neutral region of the emitter layer. This quasi-drift field induces valence bandgap grading within the emitter layer so as to accelerate movement of holes from the base layer through the emitter layer. Accelerated movement of the holes from the base layer through the emitter layer reduces emitter delay time and thereby, increases the cut-off frequency $(f_T)$ and the maximum oscillation frequency $(f_{MAX})$ of the resultant HBT.

4 Claims, 8 Drawing Sheets

SILICON GERMANIUM EMITTER

CROSS-REFERENCE TO RELATED APPLICATIONS

This application is a continuation of U.S. application Ser. No. 11/308,541 filed Apr. 4, 2006, now U.S. Pat. No. 7,294,869 the complete disclosure of which, in its entirety, is herein incorporated by reference.

BACKGROUND OF THE INVENTION

1. Field of the Invention

The invention relates to hetero-junction bipolar transistors and, more particularly, to a hetero-junction bipolar transistor structure with an emitter that exhibits a reduced delay time and a method of forming the structure.

2. Description of the Related Art

As the switching speed of silicon germanium (SiGe) hetero-junction bipolar transistors (HBTs) approaches and extends beyond 350 GHz, the base transit time for such HBT devices is in the range of approximately 100 fs. The emitter delay time for such devices is typically smaller than the base transit time. However, as base size is scaled down, the emitter transit time is becoming an increasing portion of the overall HBT forward transit time. In the near future emitter delay time may actually be of the same magnitude as base transit times and may effectively limit the transistor AC performance. Thus, there is a need in the art for a SiGe HBT that exhibits a reduced emitter transit time in order to obtain an improved overall forward transit time and improved switching speed performance.

SUMMARY OF THE INVENTION

In view of the foregoing, disclosed herein is a hetero-junction bipolar transistor (HBT) that incorporates a silicon-germanium emitter layer with a graded germanium concentration profile in order to reduce the emitter delay time and, thereby, increase the cut-off frequency ($f_T$) and the maximum oscillation frequency ($f_{MAX}$).

An embodiment of the HBT structure of the invention comprises a first conductivity type mono-crystalline silicon-germanium emitter layer (e.g., a emitter layer doped with an n-type dopant, such as arsenic (As), phosphorus (P), or antimony (Sb)). The HBT structure further comprises a second conductivity type mono-crystalline base layer (e.g., a base layer doped with a p-type dopant, such as boron (B)) adjacent to a first side of the emitter layer (e.g., below the emitter layer) and a first conductivity type polysilicon electrode (e.g., a polysilicon electrode doped with an n-type dopant) that is adjacent to a second side of the emitter layer (e.g., above the emitter layer).

More specifically, the emitter layer of the HBT structure of the invention comprises a depletion region adjacent to the base layer and a neutral region between the depletion region and the polysilicon electrode. The emitter layer also comprises germanium. The concentration of germanium in the emitter layer is graded such that it increases between the first side that is adjacent to the base layer and the second side that is adjacent to the polysilicon electrode. Various graded germanium concentration profiles are anticipated. For example, the gradient of the germanium concentration can increase linearly and can range from approximately 0% adjacent to the base layer up to between 10% and 40% adjacent to the polysilicon electrode (e.g., preferably up to approximately 30% but no greater than 40%). The gradient of the germanium concentration can also increase exponentially and can range from approximately 0% adjacent to the base layer up to between 10% and 40% adjacent to the polysilicon electrode (e.g., preferably up to approximately 30% but no greater than 40%). Alternatively, the concentration of germanium can plateau at approximately 0% adjacent to the base layer and ramps up from approximately 0% up to between 10% and 40% adjacent to the polysilicon electrode. By incorporating the germanium in graded concentrations through the emitter layer a quasi-drift field is created in the neutral region of the emitter layer. This quasi-drift field lowers the emitter delay time for the neutral region so as to increase cut-off frequency ($f_T$). The quasi-drift field is induced by the valence bandgap grading across the neutral region so as to accelerate movement of minority carriers (e.g., holes) from the base layer through the emitter layer which increases the cut-off frequency ($f_T$).

An embodiment of a method of forming the hetero-junction bipolar transistor structure of the invention comprises forming a first conductivity type collector layer (e.g., a silicon collector layer doped with an n-type dopant, such as arsenic (As), phosphorus (P), or antimony (Sb), on a p-type substrate) in a second conductivity type substrate (e.g., a p-type substrate). Then, a mono-crystalline silicon layer is deposited (e.g., by a low temperature thermal epitaxy (LTE) process or Molecular Beam Epitaxy (MBE)) on the collector layer.

During this deposition process, a pure silicon buffer layer can first be deposited onto the collector layer. Then, germanium can be introduced into a lower portion of the silicon layer. Specifically, germanium can be introduced with a rapid ramp up in the germanium concentration (e.g., up to a maximum of approximately 40%). After the ramp up phase, the concentration of germanium introduced into the lower portion of the silicon layer can plateau for a period of time and then, begin a slow ramp down to approximately 0% germanium. Additionally, after the start and before the finish of the ramp down phase of introducing germanium into the lower portion of the silicon layer, a second conductivity type dopant (e.g., a p-type dopant, such as boron (B)) can simultaneously be introduced into this lower portion of the silicon layer. The deposition processes, described above, for the lower portion of the silicon layer effectively form the second conductivity type base layer (e.g., p-type base layer) of the HBT of the invention.

After the lower portion of the silicon layer is doped (e.g., with the p-type dopant) and the germanium concentration is ramped down, the deposition of the silicon layer continues in order to form an upper portion of the silicon layer. During the deposition of this upper portion of the silicon layer, germanium is again introduced. Specifically, germanium is introduced into the upper portion of the silicon layer such that the concentration of germanium is graded. For example, the germanium concentration can be increased linearly as the silicon is deposited (e.g., steadily ramping up from approximately 0% adjacent to the base layer up to between 10% and 40% at the top surface of the upper portion). The germanium concentration can be increased exponentially as silicon layer is deposited (e.g., slowly and then more quickly ramping up from approximately 0% adjacent to the base layer up to between 10% and 40% at the top surface of the upper portion). Alternatively, the germanium concentration can be maintained at approximately 0% adjacent to the base layer and can then ramp up from approximately 0% up to between 10% and 40% at the top surface of the upper portion.

Once the silicon layer is deposited, a first conductivity type polysilicon layer (e.g., a polysilicon layer doped with an n-type dopant, such as arsenic (As), phosphorus (P), or antimony (Sb)) can be formed adjacent to (e.g., deposited on) the upper portion of the silicon layer. A thermal anneal process is then performed in order to diffuse the first conductivity type dopant from this polysilicon layer into the upper portion of the silicon layer to form the first conductivity type emitter layer (e.g., n-type emitter layer) of the HBT structure of the invention. Alternatively, the emitter layer can be formed by an in-situ doping process that simultaneously introduces both the germanium and the appropriate conductivity type dopant (e.g., the n-type dopant) into the upper portion of the silicon layer as it is being deposited.

Therefore, by forming the HBT structure using the method described above, the emitter layer is formed with a depletion region adjacent to the base layer and a neutral region between the depletion region and the polysilicon layer that contains a quasi-drift field which is created by the graded germanium concentrations.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 1:
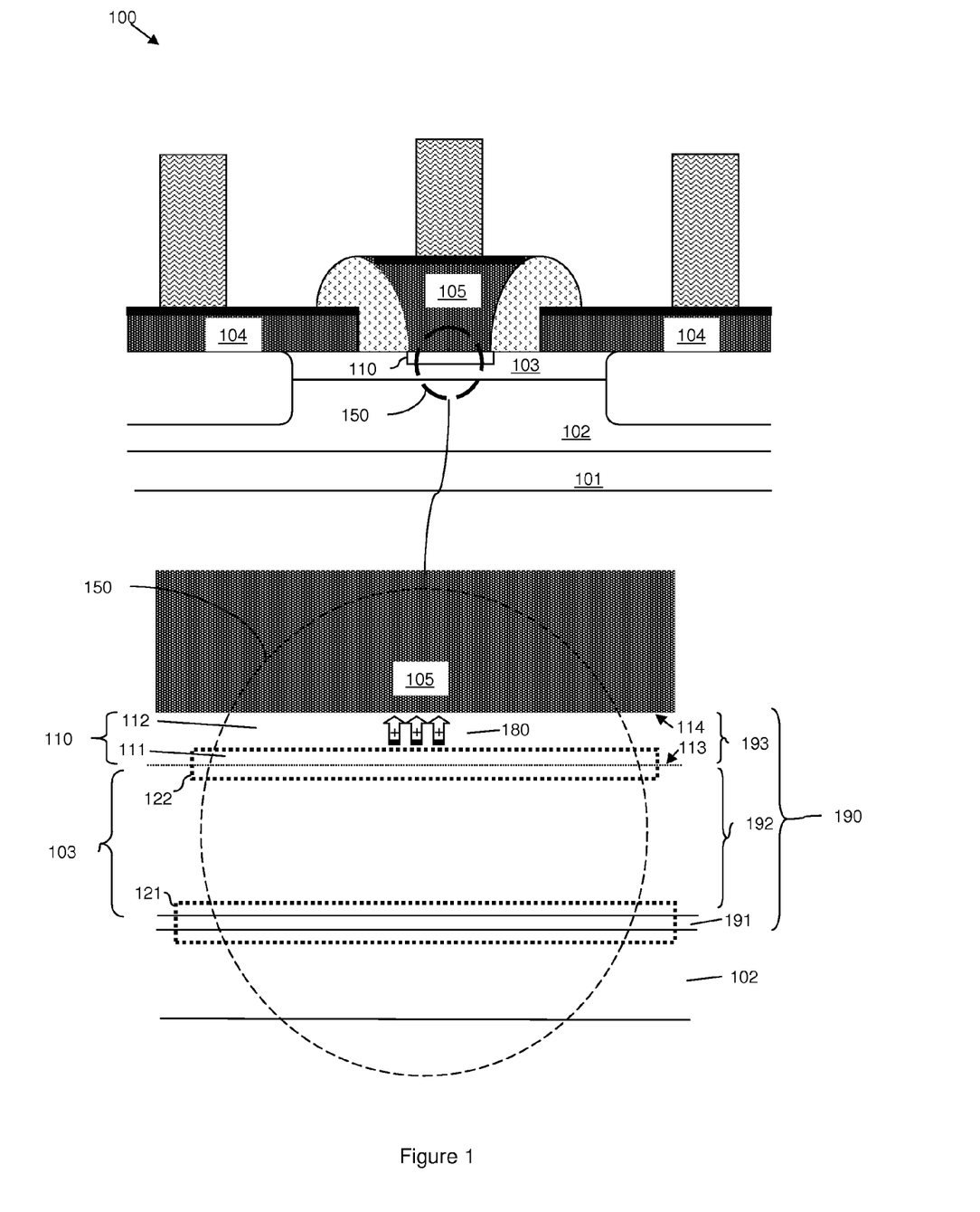
FIG. 1 is a schematic diagram of an embodiment of a HBT structure 100 of the invention.

Referring to FIG. 1, disclosed is a hetero-junction bipolar transistor (HBT) structure 100. The structure 100 comprises two adjacent p-n junctions. Specifically, the HBT 100 comprises a first conductivity type collector layer 102 (e.g., a mono-crystalline silicon collector layer doped with an n-type dopant, such as arsenic (As), phosphorus (P), or antimony (Sb)). This collector layer 102 can be formed, for example, by implanting the first conductivity type dopant into a second conductivity type semiconductor substrate (e.g., a silicon substrate doped with a p-type dopant, such as boron (B)). A second conductivity type mono-crystalline intrinsic base layer 103 (e.g., a p-type silicon base layer) is positioned adjacent to (e.g., above) the collector layer 102. This intrinsic base layer 103 may further be connected on either side to raised extrinsic base layers 104. A first conductivity type emitter layer 110 (e.g., an n-type emitter layer) is adjacent to (e.g., above) the base layer 103. The emitter layer 110 is contacted by an electrode (e.g., a first conductivity type polysilicon electrode 105) between the raised extrinsic base layers 104. The junctions 121 and 122 between the layers 102, 103 and 110 (e.g., between the collector layer 102 and the base layer 103 and between base layer 102 and the emitter layer 110) comprise shared depletion regions. The remaining portions of the layers 102, 103, and 110 comprise neutral regions (also referred to in the art as quasi-neutral regions).

Figure 2A:
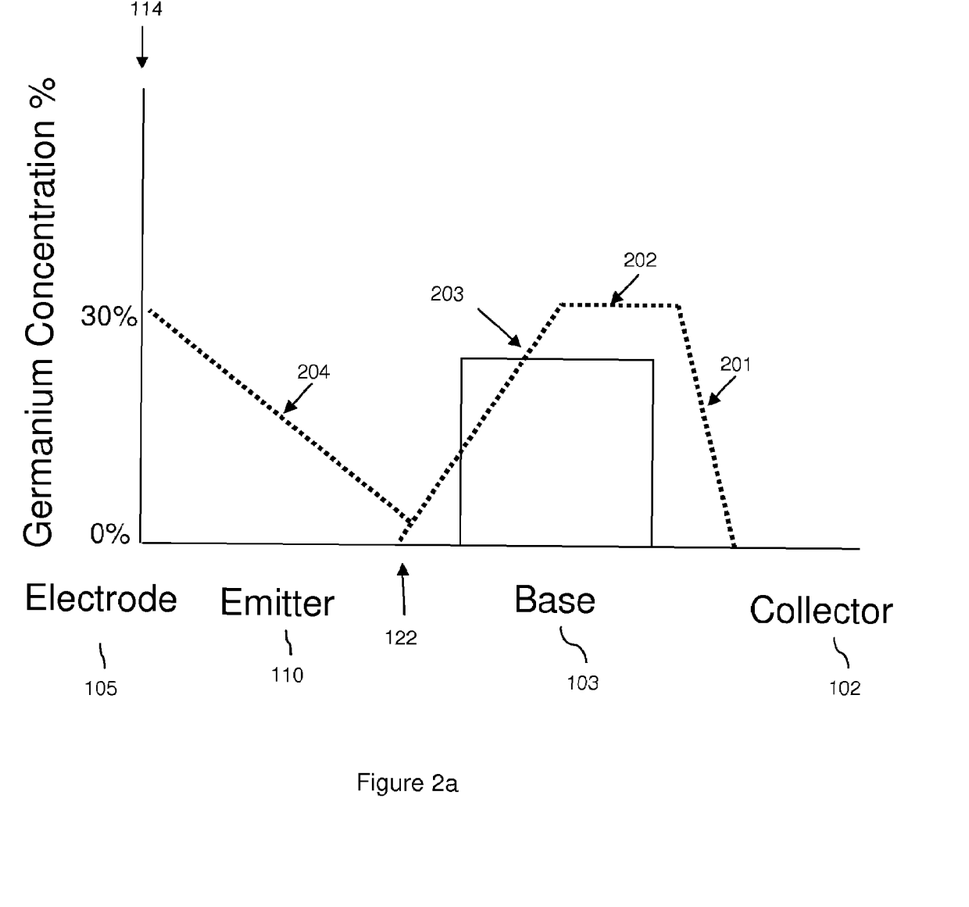
FIGS. 2a-c are schematic diagrams illustrating possible graded germanium concentration profiles across the emitter, base and collector layers of FIG. 1.
Figure 2B:
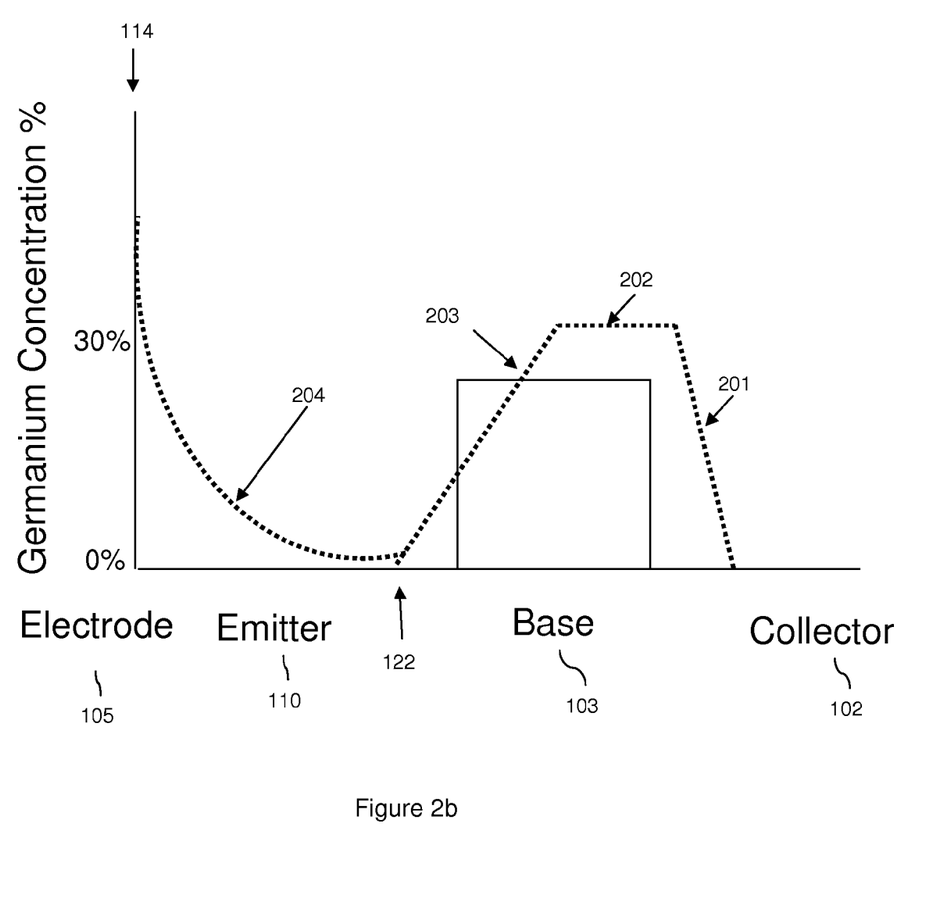
Figure 2C:
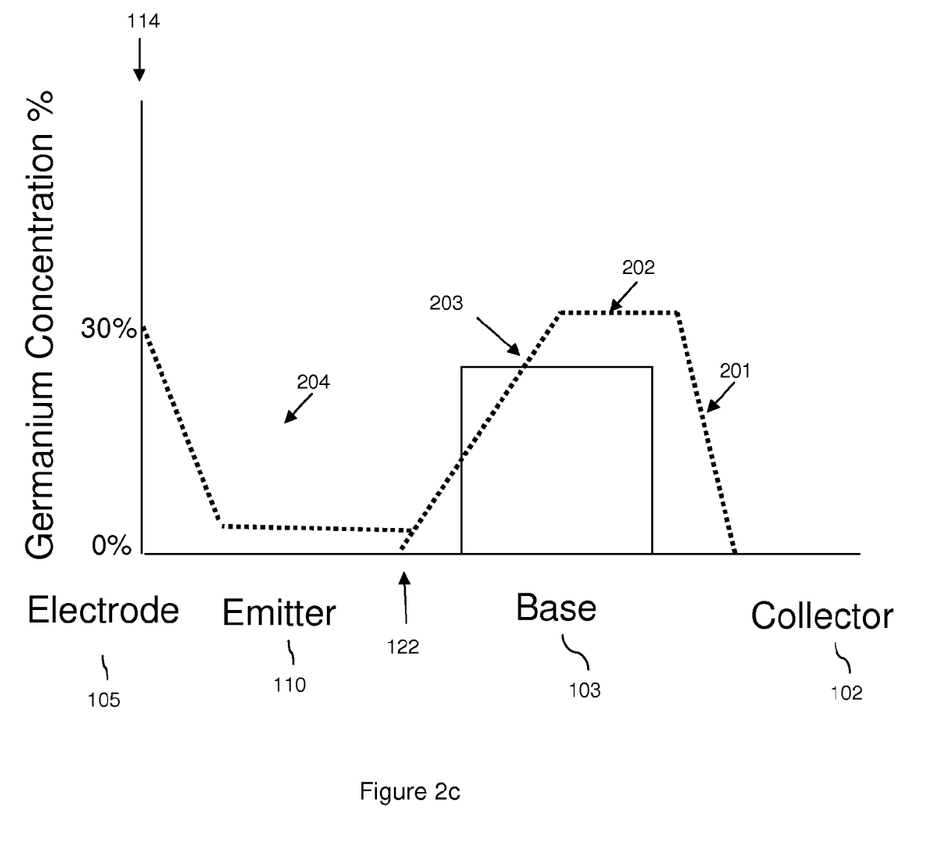

Germanium can be introduced into the base layer 103 of the HBT structure of the invention. Germanium has a lower energy bandgap as compared to silicon (e.g., approximately 0.66 eV for germanium as compared to approximately 1.12 eV for silicon). Thus, introducing germanium into the base layer 103 reduces the overall energy band gap of the base layer 103. Additionally, referring to FIG. 2, having a graded germanium concentration profile with a steep ramp up 201 at the junction between the collector layer 102 and base layer 103, a plateau 202 and a steady ramp down 203 towards the junction between the base layer 103 and the emitter layer 110 can be used to create a quasi-drift field in the neutral region of the base layer 103. This base layer quasi-drift field will accelerate minority carriers (e.g., electrons in a p-type base) from the emitter to the collector effectively lowering the base layer 103 transit time, thereby, increasing the current-gain cut-off frequency ($f_T$).

Currently, the switching speeds of silicon germanium (SiGe) hetero-junction bipolar transistors (HBTs) are reaching up to and beyond 350 GHz, the base transit time for such HBT devices is in the range of approximately 100 fs and the emitter layer 110 delay time is typically smaller than this base transit time. However, as base layer 103 size is scaled down, the emitter layer 110 transit time is becoming an increasing portion of the total forward transit time. In the near future HBT structures may be formed such that the emitter layer 110 transit time is of the same magnitude as the base layer 103 transit time, thus, limiting the transistor AC performance. Consequently, as mentioned above, there is a need in the art for a SiGe HBT that exhibits a reduced emitter transit time in order to obtain an improved overall forward transit time and improved switch speed performance.

In view of the foregoing, the hetero-junction bipolar transistor 100 (HBT) of the present invention further incorporates germanium into the emitter layer 110 as well as into the base layer 103. Specifically, the HBT 100 comprises a silicon-germanium emitter layer 110 with a graded germanium concentration profile that creates a quasi-drift field in order to reduce the emitter delay time and, thereby, increase the current-gain cut-off frequency ($f_T$) and the maximum oscillation frequency ($f_{MAX}$).

More specifically, referring to FIG. 1 and particularly, to the exploded portion 150 of FIG. 1, an embodiment of the HBT structure 100 of the invention comprises a first conductivity type mono-crystalline silicon-germanium emitter layer 110 (e.g., a emitter layer doped with an n-type dopant, such as arsenic (As), phosphorus (P), or antimony (Sb)). The HBT structure 100 further comprises a second conductivity type mono-crystalline base layer 103 (e.g., a base layer doped with a p-type dopant, such as boron (B)) adjacent to a first side of the emitter layer (e.g., below the emitter layer) and a first conductivity type electrode 105 (e.g., a polysilicon electrode doped with an n-type dopant) that is adjacent to a second side of the emitter layer 110 (e.g., above the emitter layer).

Figure 3A:
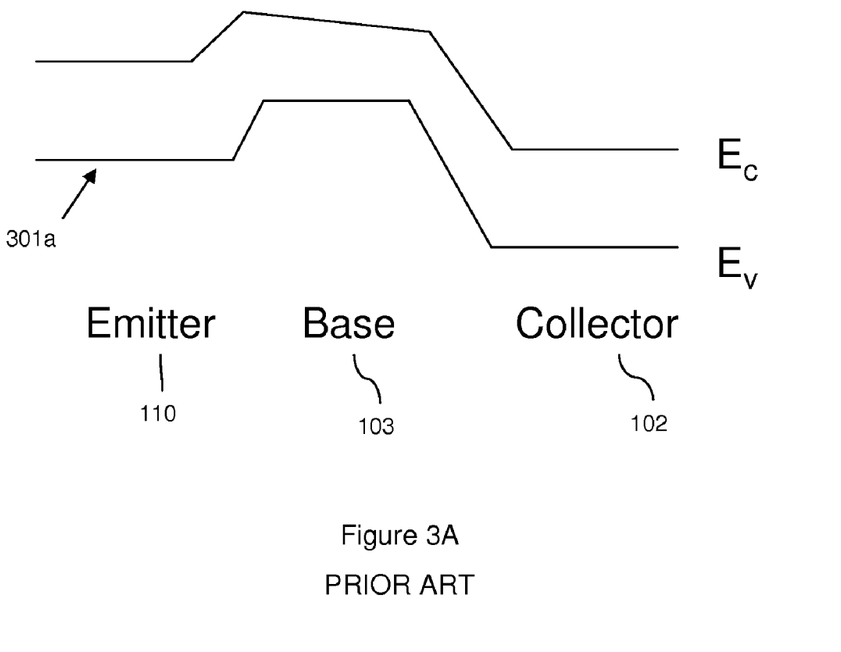
FIG. 3A is an energy band diagram for a conventional HBT structure.
Figure 3B:
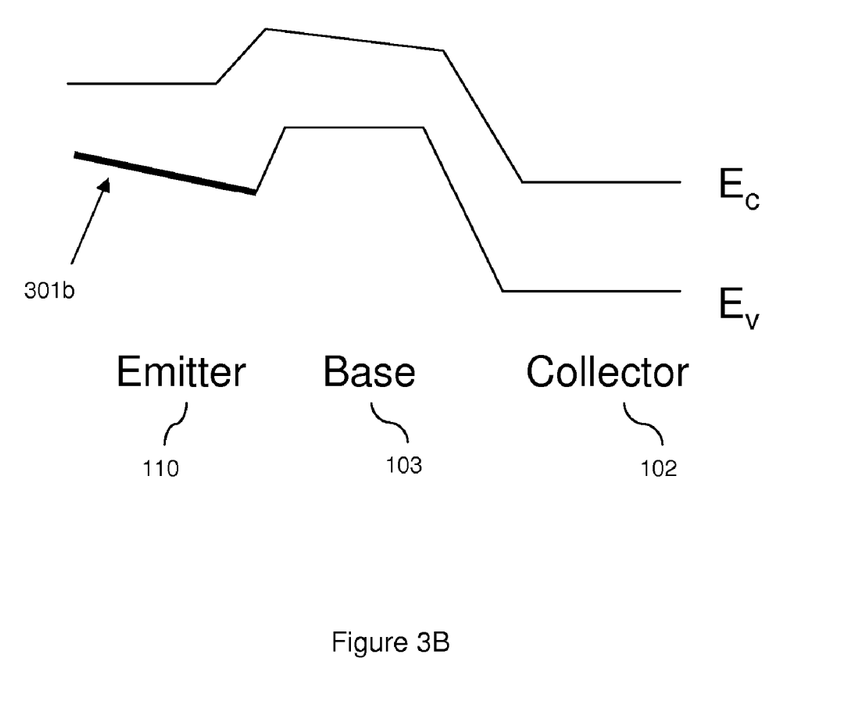
FIG. 3B is an energy band diagram for the HBT structure of the invention.

This emitter layer 110 comprises a depletion region 111 at the junction 122 between the base layer 103 and the emitter layer 110 and a neutral region 112 between the depletion region 111 and the polysilicon electrode 105. The emitter layer 110 further comprises germanium and the concentration of the germanium is graded such it ramps up between the first side 113 of the emitter layer that is adjacent to the base layer 103 and the second side 114 that is adjacent to the polysilicon electrode 105. Referring to FIGS. 2a-c in combination with FIG. 1, various graded germanium concentration profiles are anticipated. For example, referring to FIG. 2a, the gradient 204 of the germanium concentration can increase linearly and can range from approximately 0% adjacent to the base layer 103 (i.e., at the junction 122) up to between 10% and 40% adjacent to the polysilicon electrode 105 (at the top surface 114 of the emitter layer 110) (e.g., preferably up to approximately 30% but no greater than 40%). Referring to FIG. 2b, the gradient 204 of the germanium concentration can also increase exponentially and can range from approximately 0% adjacent to the base layer 103 up to between 10% and 40% adjacent to the polysilicon electrode 105 (e.g., preferably up to approximately 30% but no greater than 40%). Alternatively, referring to gradient 204 of FIG. 2c, the concentration of germanium can plateau at approximately 0% adjacent to the base layer 103 and can then ramp up from approximately 0% up to between 10% and 40% adjacent to the polysilicon electrode 105. This graded germanium concentration profile across the emitter layer 110 creates a quasi-drift field 180 through the neutral region 112 of the emitter layer 110. This emitter layer quasi-drift field 180 accelerates the minority carriers (e.g., holes in a n-type emitter) within the neutral region 112 and, thereby, increase the cut-off frequency ($f_T$) of the HBT 100. As illustrated in the energy band diagram of FIG. 3A, without such a quasi-drift field the valence energy bandgap 301a in the emitter layer 110 is constant. However, referring to the energy band diagram of FIG. 3B, the quasi-drift field in the emitter layer 110 of the HBT structure 100 induces a grading in the valence energy bandgap 301b across the neutral region so as to accelerate movement of minority carriers (e.g., holes) from the base layer 103 through the emitter layer 110 and, thereby, further increase the cut-off frequency ($f_T$) of the HBT structure 100.

Specifically, for a SiGe HBT the cut-off frequency ($f_T$) can be written as:

$f_T = 1/2[1/g_m(C_{eb}+C_{cb})+T_b+T_e+T_{bc}]^{-1}$, where $C_{eb}$ is the parasitic emitter-base junction capacitance, $C_{cb}$ is the parasitic collector-base junction capacitance, $g_m$ is transductance, $T_b$ is the base transit time, $T_e$ is the emitter delay time and $T_{bc}$ is the base-collector junction depletion layer time (see J. D. Cressler, "SiGe HBT technology: A new contender for si-based RF and microwave circuit applications," IEEE Transactions On Microwave Theory and Techniques, vol. 46, no. 5, pp. 572-589, May 1998 (incorporated herein by reference)).

Additionally, the emitter delay time for a SiGe HBT can be written as:

$T_e = (1/\beta)*[(W_e/S_{pe})+(W_e^2/2D_{pe})]$, where $T_e$ is the emitter time delay, $\beta$ is ac current gain, $W_e$ is neutral emitter width, $S_{pe}$ is hole surface recombination velocity at the emitter-polysilicon interface, and $D_{pe}$ is hole diffusivity in the emitter. (See J. D. Cressler and G. Niu, Silicon-Germanium Heterojunction Bipolar Transistors, Artech House, Boston, Mass. December 2003, page 170).

Consequently, by introducing a germanium ramp in the emitter, $D_{pe}$ is effectively increased by a factor related to the germanium-induced bandgap grading across the neutral emitter. By increasing $D_{pe}$ the emitter time delay component $T_e$ of the forward transit time is reduced. Finally, by reducing $T_e$, the cut-off frequency ($f_T$) is increased.

Figure 4:
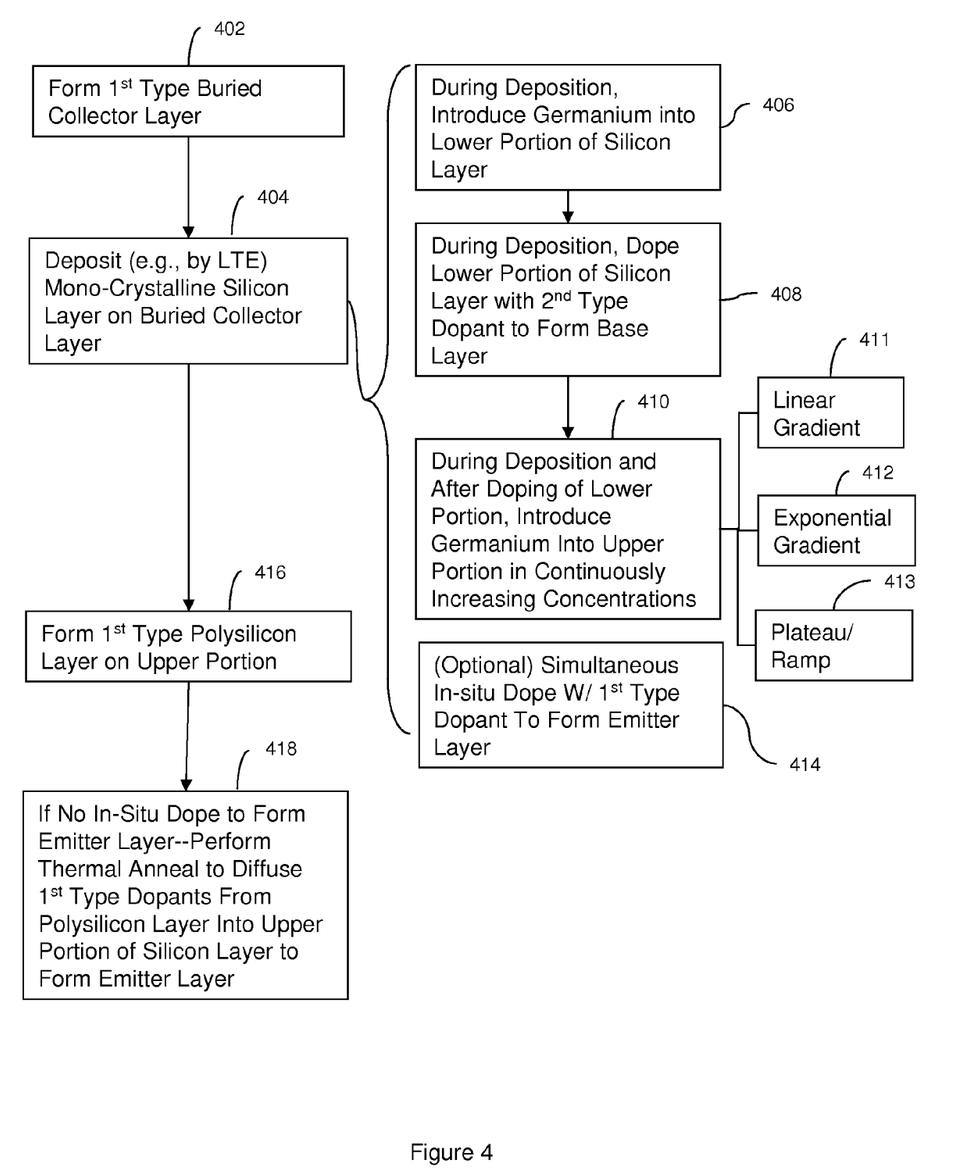
FIG. 4 is a flow diagram illustrating a method of the invention.

Referring to FIG. 4 in combination with FIG. 1, an embodiment of the method of forming the hetero-junction bipolar transistor (HBT) structure 100 of the invention comprises forming a first conductivity type collector layer 102 (402). For example, a buried collector layer 102 can be formed by ion-implanting an n-type dopant (e.g., arsenic (As), phosphorus (P), or antimony (Sb)) into a p-type silicon substrate. An electrode (e.g., an n-doped polysilicon electrode, not shown) can be formed during subsequent processing to contact the collector layer 102.

After forming the collector layer 102, shallow trench isolation structures 501 can be formed to define regions of the collector layer 102.

Figure 5:
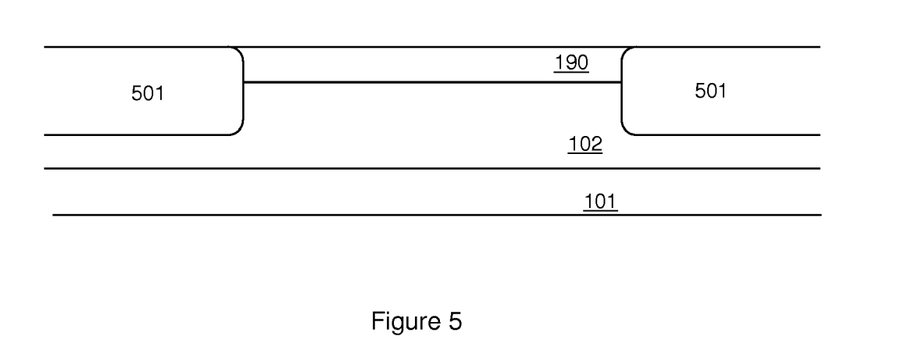
FIG. 5 is a schematic diagram illustrating a partially completed HBT structure of the invention.

Then, a mono-crystalline silicon layer 190 is deposited (e.g., grown by performing a conventional low temperature thermal epitaxy process) on the collector layer 102 (404, see FIG. 5). During this deposition process (404), a silicon buffer layer 191, a lower portion 192 of the silicon layer and an upper portion 193 of the silicon layer 190 are formed (see FIG. 6).

Figure 6:
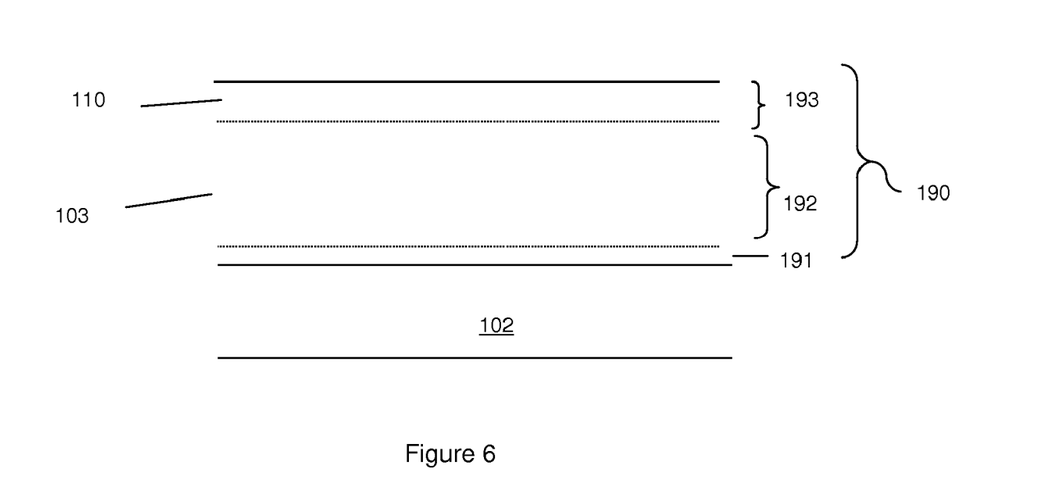
FIG. 6 is a schematic diagram illustrating a partially completed HBT structure of the invention.

The silicon buffer layer 191 can first be deposited onto the collector layer. This buffer layer 191 provides a pure silicon interface (an interface in the absence of germanium or other impurities) between the collector layer 102 (e.g., the n-type collector layer) and the subsequently formed base layer 103.

After the buffer layer 191 is deposited, germanium can be introduced into the lower portion 192 of the silicon layer 190 as it is deposited (406). Specifically, germanium can be introduced with a rapid ramp up 201 in the germanium concentration (e.g., up to approximately 30% and preferably no more than 40%) (see FIG. 2). After the ramp up phase, the concentration of germanium introduced into the lower portion 192 of the silicon layer 190 can plateau 202 for a period of time and then, begin a slow ramp down 203 to approximately 0% germanium (see FIG. 2). After the start and before the finish of the ramp down phase, a second conductivity type dopant (e.g., a p-type dopant, such as boron (B)) can simultaneously be introduced into the lower portion 192 of the silicon layer 190. The deposition processes, described above, for the lower portion 192 of the silicon layer 190 effectively form the second conductivity type base layer 103 (e.g., p-type base layer) of the HBT 100 of the invention.

After the lower portion 192 of the silicon layer 190 is doped (e.g., with the p-type dopant) and the germanium concentration is ramped down, the deposition of the silicon layer 190 continues in order to form an upper portion 193. During the deposition of the upper portion 193 of the silicon layer 190, germanium is again introduced into the silicon layer 190 (410).

Specifically, germanium is introduced into the upper portion of the silicon layer such that the concentration of germanium is graded (410, see FIGS. 2a-2c). For example, referring to FIG. 2a, the germanium concentration 204 can be increased linearly as the silicon is deposited such that the concentration (e.g., steadily ramping up from approximately 0% adjacent to the base layer up to between 10% and 40% at the top surface of the upper portion) (411). Referring to FIG. 2b, the germanium concentration 204 can be increased exponentially as silicon layer is deposited (e.g., slowly and then more quickly ramping up from approximately 0% adjacent to the base layer up to between 10% and 40% at the top surface of the upper portion) (412). Alternatively, the germanium concentration 204 can be maintained at approximately 0% adjacent to the base layer and can then ramp up from approximately 0% up to between 10% and 40% at the top surface of the upper portion (413).

Optionally, in addition to introducing germanium into the upper portion of the silicon layer as it is deposited, an in-situ doping process can simultaneously be performed in order to also introduce a first conductivity type dopant (e.g., an n-type dopant such as arsenic (As), phosphorus (P), or antimony (Sb)) into the upper portion of the silicon layer, and thereby, form the emitter layer with a first conductivity type (414). Alternatively, this first conductivity type dopant can be introduced during subsequent processing, discussed below.

Once the silicon layer 190 is deposited, additional well-known processing steps may be performed in order to form defined raised extrinsic base layers 104 above each end of the intrinsic base layer 103 as well as electrodes to the raised extrinsic base layers 104.

Figure 7:
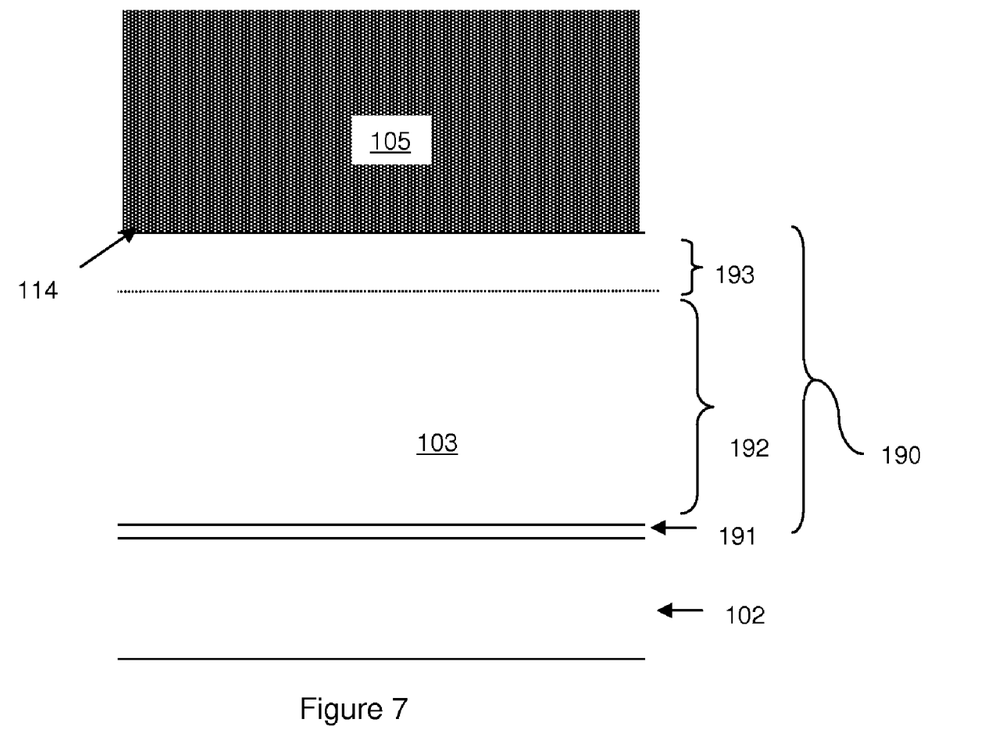
FIG. 7 is a schematic diagram illustrating a partially completed HBT structure of the invention.

A first conductivity type polysilicon layer 105 (e.g., a polysilicon layer doped with an n-type dopant, such as arsenic (As), phosphorus (P), or antimony (Sb)) can be formed adjacent to the upper portion 193 of the silicon layer 190 (416, see FIG. 7) between the raised extrinsic base layers 104. Known methods may be used to form this polysilicon layer 105. For example, the polysilicon emitter electrode 105 may be self-aligned between dielectric spacers 107 that are formed adjacent to the raised extrinsic bases 104.

If in-situ doping is not used to form the emitter layer (at process 414 discussed above), then, a thermal anneal process can be performed in order to diffuse the first conductivity type dopant from the doped polysilicon layer 105 into the upper portion 193 of the silicon layer in order to form the first conductivity type emitter layer 110 (e.g., n-type emitter layer) of the HBT structure 100 of the invention Referring again to FIG. 1 and particularly, to the exploded portion 150 of FIG. 1, by forming the emitter layer 110, as described above, the emitter layer 110 is formed with a depletion region 111 at the junction 122 between the base layer 103 and the emitter layer 110 and a neutral emitter region 112 between the depletion region 111 and the polysilicon layer 105 (i.e., the polysilicon emitter electrode) that contains a quasi-drift field 180 created by the graded germanium concentration. The quasi-drift field in the emitter layer reduces the emitter delay time and, thereby, increases the current-gain cut-off frequency ($f_T$) and the maximum oscillation frequency ($f_{MAX}$) of the resultant HBT.

Therefore, disclosed above are an improved hetero-junction bipolar transistor (HBT) structure and a method of forming the structure that incorporates a silicon-germanium emitter layer with a graded germanium profile. The graded germanium profile creates a quasi-drift field in the neutral region of the emitter layer. This quasi-drift field induces valence bandgap grading within the emitter layer so as to accelerate movement of holes from the base layer through the emitter layer. Accelerated movement of the holes from the base layer through the emitter layer reduces emitter delay time and thereby, increases the cut-off frequency ($f_T$) and the maximum oscillation frequency ($f_{MAX}$) of the resultant HBT.

While the invention has been described in terms of embodiments, those skilled in the art will recognize that the invention can be practiced with modification within the spirit and scope of the appended claims.

What is claimed is:

1. A hetero-junction bipolar transistor comprising:
   a mono-crystalline silicon-germanium emitter layer with a first side and a second side and having a first conductivity type;
   a mono-crystalline base layer adjacent to said first side and having a second conductivity type;
   a polysilicon electrode adjacent to said second side and having said first conductivity type, wherein said emitter layer comprises germanium and wherein concentration of said germanium in said emitter layer is graded such that said concentration increases linearly from said first side to said second side; and
   a pure, undoped, mono-crystalline silicon buffer layer below said base layer; and
   a mono-crystalline silicon collector layer below said buffer layer, said buffer layer separating said base layer from said collector layer.

2. A hetero-junction bipolar transistor comprising:
   an n-type mono-crystalline silicon-germanium emitter layer with a first side and a second side;
   a p-type mono-crystalline base layer adjacent to said first side;
   an n-type polysilicon electrode adjacent to said second side, wherein said emitter layer comprises germanium and wherein concentration of said germanium in said emitter layer is graded such that said concentration increases linearly from said first side to said second side; and
   a pure, undoped, mono-crystalline silicon buffer layer below said base layer; and
   a mono-crystalline silicon collector layer below said buffer layer, said buffer layer separating said base layer from said collector layer.

3. A hetero-junction bipolar transistor comprising:
   a mono-crystalline silicon-germanium emitter layer with a first side and a second side and having a first conductivity type;
   a mono-crystalline base layer adjacent to said first side and having a second conductivity type; and
   a polysilicon electrode adjacent to said second side and having said first conductivity type, wherein said emitter layer comprises germanium, wherein concentration of said germanium in said emitter layer is graded such that said concentration increases linearly from said first side to said second side, and
   wherein said concentration increases linearly from approximately 0% adjacent to said first side to between 30% and 40% adjacent to said second side.

4. A hetero-junction bipolar transistor comprising:
   an n-type mono-crystalline silicon-germanium emitter layer with a first side and a second side;
   a p-type mono-crystalline base layer adjacent to said first side; and
   an n-type polysilicon electrode adjacent to said second side, wherein said emitter layer comprises germanium, wherein concentration of said germanium in said emitter layer is graded such that said concentration increases linearly from said first side to said second side, and wherein said concentration increases linearly from approximately 0% adjacent to said first side to between 30% and 40% adjacent to said second side.

* * * * *